(12) United States Patent
Gagnon et al.

(10) Patent No.: US 7,218,078 B2
(45) Date of Patent: May 15, 2007

(54) BACK-UP POWER SYSTEM AND MONITORING SYSTEM THEREFOR

(75) Inventors: Philippe Gagnon, Boucherville (CA); Denis Pomerleau, St-Constant (CA); Roger Paradis, Varennes (CA)

(73) Assignee: Avestor Limited Partnership, Boucherville (CA)

( * ) Notice: Subject to any disclaimer, the term of this patent is extended or adjusted under 35 U.S.C. 154(b) by 366 days.

(21) Appl. No.: 10/478,746

(22) PCT Filed: May 24, 2002

(86) PCT No.: PCT/CA02/00766

§ 371 (c)(1),
(2), (4) Date: May 12, 2004

(87) PCT Pub. No.: WO02/097946

PCT Pub. Date: Dec. 5, 2002

(65) Prior Publication Data
US 2004/0178770 A1    Sep. 16, 2004

(30) Foreign Application Priority Data
May 25, 2001    (CA) .................................. 2348586

(51) Int. Cl.
*H01M 10/46*    (2006.01)
(52) U.S. Cl. ...................................... 320/132
(58) Field of Classification Search ................ 320/116, 320/132, 149, 150; 324/426, 430, 431, 433
See application file for complete search history.

(56) References Cited

U.S. PATENT DOCUMENTS

| | | |
|---|---|---|
| 4,678,998 A | 7/1987 | Muramatsu |
| 5,047,722 A | 9/1991 | Wurst et al. |
| 5,126,675 A | 6/1992 | Yang |
| 5,600,230 A | 2/1997 | Dunstan |
| 5,631,540 A | 5/1997 | Nguyen |
| 5,680,027 A | 10/1997 | Hiratsuka et al. |
| 5,705,929 A | 1/1998 | Caravello et al. |
| 5,936,383 A | 8/1999 | Ng et al. |
| 6,072,299 A | 6/2000 | Kurle et al. |
| 6,124,701 A | 9/2000 | McDowell et al. |
| 6,191,590 B1 | 2/2001 | Klütz et al. |
| 6,211,654 B1 | 4/2001 | O'Sullivan |
| 6,218,809 B1 | 4/2001 | Downs et al. |
| 6,307,377 B1 | 10/2001 | Cummings et al. |

*Primary Examiner*—Edward H. Tso
(74) *Attorney, Agent, or Firm*—Osler, Hoskin & Harcourt LLP

(57) ABSTRACT

A back-up power system having a monitoring system for determining, and for allowing remote monitoring of, a back-up time can be provided by a plurality of batteries for a given application, at all times. The back-up power system includes a plurality of batteries, each having an integrated circuit adapted to monitor individual battery's state of health. The back-up power system also includes a data management unit for evaluating the back-up time available from the plurality of batteries based on a sum of individual battery available capacity, a measured ambient temperature and a continuously updated measured application current load. The available back-up time and the measured application current load are accessible to a remote user via a communication link.

15 Claims, 1 Drawing Sheet

BACK-UP POWER SYSTEM AND MONITORING SYSTEM THEREFOR

FIELD OF THE INVENTION

The present invention relates to the field of power systems. More specifically, the invention relates to a back-up power system, as well as to a method for determining a battery string back-up time that can be provided by a plurality of batteries, at all times, in a given application requiring a given current load.

BACKGROUND OF THE INVENTION

Electric public utilities normally provide energy to telecommunication networks. Historically, the traditional wire line telephony networks have been required to have extremely high reliability levels (between 99.999% and 99.99999%) to handle lifeline services such as 911 and alarm systems, while the electric utilities only offer a 99.9% reliability level. It is therefore important and considered best practice for telephone companies to have 8 hours of standby energy to power their network equipment in the event of a power outage. More recent telecommunication technologies, such as wireless and broadband, are also moving towards a high level of network reliability.

Batteries for power sources are usually provided in banks or strings, for example, a string of 24 batteries is often used for back-up purposes in central offices of telecommunications providers and in remote locations of transmission stations. These backup battery power systems provide the energy to power equipment in the event of an electrical outage or failure. Therefore, maintaining the reliability of battery power systems, especially backup battery power systems, is extremely important. Further, it is important to be able to predict the level of power needed in case of power outages or failures and plan where extra batteries may be needed.

For the last century, operators and equipment suppliers have struggled to offset the costs and risks associated with battery reliability in the hostile remote environment. Much has been invested in lead-acid battery design effort, in charging system design, and in monitoring and prediction algorithm technology to overcome the problems associated with lead-acid batteries. It is now recognized that lead-acid batteries have reached the maximum performance attainable by their electrochemical system, and that fundamental issues related to the unpredictability of their end-of-life coupled with their short life under field conditions are not going to be resolved.

End-users, either in the telecommunication industry or in other industries having similar requirements, have a need to maintain reliability at required levels. This need cannot be filled when using lead-acid batteries because of the unpredictable nature of their electrochemical system. Its is almost impossible to accurately determine their State-Of-Charge (SOC) or State-Of-Health (SOH) over the life of lead-acid batteries. Typically, the only time at which end-users have an accurate measure of the batteries' SOC and SOH is during installation of brand new strings of batteries. As soon as the batteries have been exposed to field conditions, end-users cannot dynamically determine the battery's SOC and SOH except by performing a deep battery discharge, which affect the SOC and SOH and requires every equipment site to be visited by end-users. Furthermore, the reserve time required at each equipment site (typically 8 hours) cannot be estimated or calculated due to the lead-acid unpredictability and the fact that electrical load cannot be monitored, calculated or integrated to the battery system.

Traditional maintenance of lead-acid battery strings in the telecommunications industry has focused on a series of routines mandating periodic measurements of battery parameters, such as cell voltage and specific gravity. It was thought that if batteries were physically maintained with proper water levels, visual inspections, and correct voltage and specific gravity readings, the batteries would provide the necessary capacity when needed. However, when forced on-line, batteries often failed or produced far less than stated capacity even if they were properly maintained. It is now well-settled that these types of measurements are not accurate predictors of battery capacity.

Various systems and methods have been devised to predict or monitor State-Of-Charge of lead-acid batteries over their life span. For instance, U.S. Pat. No. 6,211,654 discloses iterative calculations based on voltage readings at specific intervals to estimate the remaining back-up time or current discharge capability of a lead-acid battery. The method disclosed provides only a rough estimate of the back-up time and does not take into account temperature variables, specific loads of the equipment, and battery age and/or deterioration.

Lithium Polymer (LP) batteries on the other hand have relatively high density energy (high energy generation in a low volume package), relatively high safety margins, and produce energy from a highly predictable electrochemical system. Lithium Polymer batteries are equipped with on-board control and monitoring integrated electronics able to accurately measure each battery's SOH and SOC individually taking into account temperature variables.

More advanced systems and methods were devised for non-specific types of batteries to monitor a battery back-up power system. For instance, U.S. Pat. No. 5,705,929 discloses a method and apparatus for centrally monitoring the capacity of batteries in a battery string including electrical leads connected to each battery terminal of the battery string. A capacity testing system a) switches between the electrical leads for sequentially selecting the leads associated with the terminals of each battery, b) measures the internal resistance of the battery associated with each selected pair of electrical leads, c) compares the internal resistance of each battery cell to an internal resistance threshold, and d) triggers an alarm when the internal resistance of a battery exceeds the internal resistance threshold. A central monitoring station monitors battery capacity data and alarm signals from various battery strings, schedules battery capacity testing, transmits control commands to each capacity testing system for i) scheduling testing, ii) initialising upload of capacity data, and iii) requesting status information, provides battery capacity data analysis, and uploads information to a network management computer. This system is an improvement over the previous manual testing procedures however it falls short in that it can only determine the apparent State of Health of the battery power system as good or not good, detecting malfunctions of the batteries (alarms) and relaying the alarms to a central monitoring system. This system is unable to accurately predict battery back-up time based on real time data. When an actual power outage occurs, the end user is left hoping that the back-up system will last.

Furthermore, when testing batteries to evaluate their capacity or state of health, most systems and apparatus known draw current from the batteries by placing a resistive load at the battery terminals for a short period of time. This leads to energy waste as the batteries must be recharged.

To fulfill the requirements of the telecommunications industry, and other critical industries using battery packs as back-up power systems when electric public utilities fail, there is a need for a reliable monitoring system that accurately predicts battery back-up time based on real time data and on changing equipment load.

SUMMARY OF THE INVENTION

According to a broad aspect, the invention provides a back-up power system having a monitoring system for determining, and for allowing remote monitoring of, a back-up time that can be provided by a plurality of batteries, at all times, in a given application requiring a given current load. The back-up power system includes a plurality of batteries, each having an integrated circuit adapted to monitor individual battery's state of health. The back-up power system also includes a data management unit for evaluating the back-up time available from the plurality of batteries. The back-up time is evaluated on the basis of a sum of individual battery available capacity, a measured ambient temperature and a continuously updated measured application current load. The value of available back-up time is accessible to a remote user via a communication link of the back-up power system.

BRIEF DESCRIPTION OF THE DRAWINGS

A detailed description of examples of implementation of the present invention is provided hereinbelow, with reference to the following drawing, in which.

Figure 1:
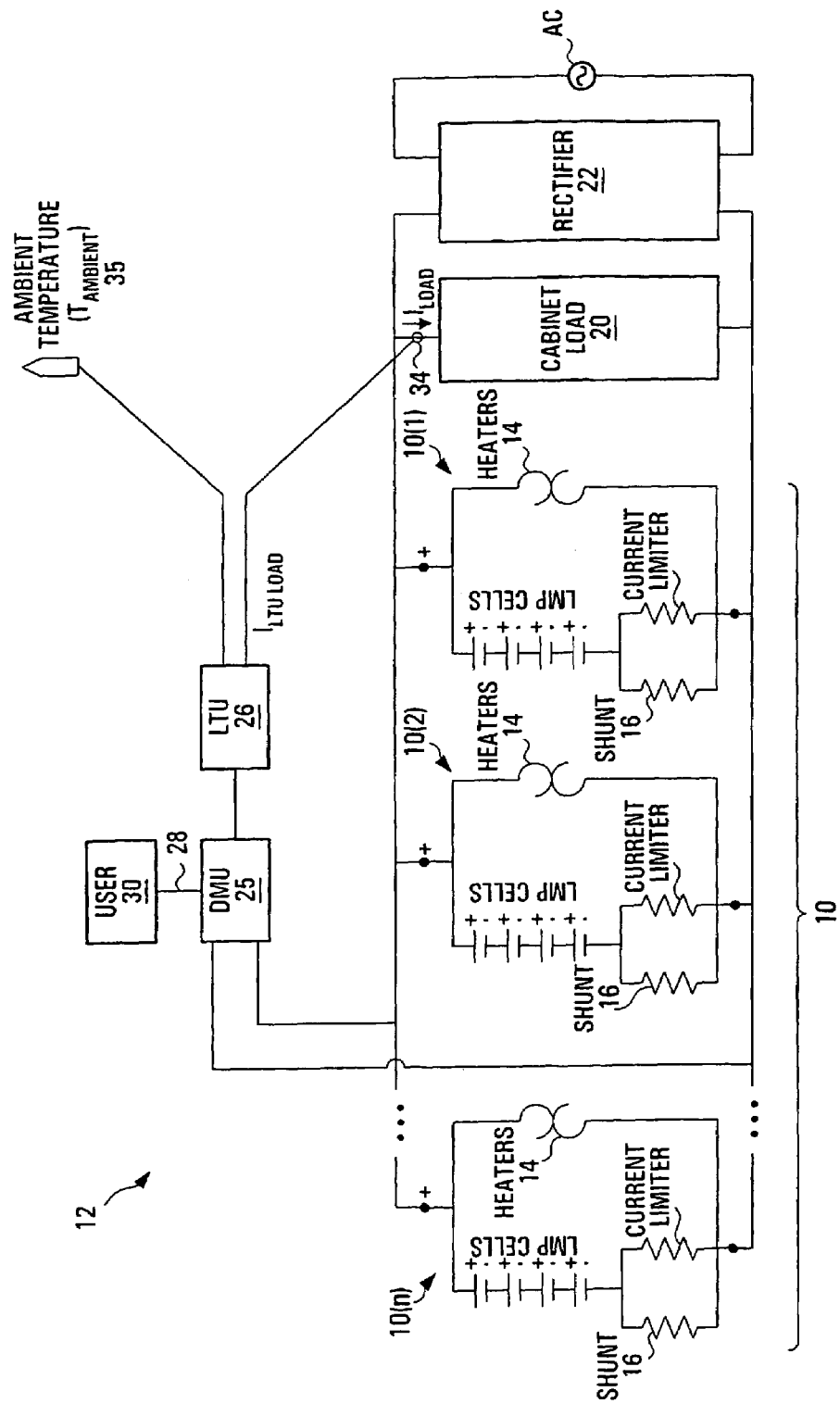
FIG. 1 is a diagram of a back-up power system of telecommunication equipment installed in a remote telecommunication outside plant.

In the drawing, embodiments of the invention are illustrated by way of example. It is to be expressly understood that the description and drawings are only for purposes of illustration and as an aid to understanding, and are not intended to be a definition of the limits of the invention.

DETAILED DESCRIPTION

FIG. 1 is a diagram illustrating a string 10 of Lithium Polymer (LP) batteries 10(1) to 10(n) installed as a back-up power source in a remote telecommunication outside plant typical to telecommunication networks. FIG. 1 also depicts a monitoring system 12 comprising a Data Management Unit 25 (DMU) and a Load Transmitter Unit 26 (LTU). The monitoring system 12 provides centralized monitoring of battery capacity for each battery 10(1) to 10(n), and of the total capacity of battery string 10. In such applications, the system is totally automated and requires no manual intervention after being installed and initialized. The telecommunications industry generally utilizes strings of batteries, i.e., groups of batteries attached in parallel, series, or both, to supply DC power to telecommunications equipment. With the use of Lithium polymer batteries in a back-up telecommunications application, two to eight LP batteries, rated at 70 Ah would be connected in parallel to form a battery string having a total theoretical capacity of between 140 Ah to 560 Ah. The particular voltages and amperages discussed are provided by way of example only, it being understood that depending upon the particular telecommunications or other applications, the batteries or battery strings may have different terminal voltages, different ratings, smaller batteries may be connected in series in strings themselves connected in parallel, different number of batteries may be connected together, etc.

An example of implementation of a back-up power system, according to the present invention, is shown in the FIG. 1. The back-up power system, or source, includes a plurality of LP batteries 10(1) to 10(n), all of which are connected in parallel connection to provide power to a load 20 such as a telecommunication cabinet, when the public utility network fails. A rectifier 22 receives AC line power from the public utility network and provides power to load 20. Rectifier 22 is connected to load 20 and to battery string 10 and provides a rectified charging voltage to recharge the string of LP batteries 10(1) to 10(n) when required. A data management unit 25 having memory for storage of data and program algorithms for data processing is connected to the integrated control and diagnosis circuit of each battery 10(1) to 10(n) and to a load transmitter unit 26. Data management unit 25 further comprises an external communication port 28 adapted to send and receive data to and from a remote user 30 either through a local connection such as a portable computer using CAN, USB, RS-232, IrDA or TCP-IP protocols or through internet or telephone linked to a remote network monitoring station using TCP-IP or modem protocols.

As previously mentioned each LP energy module 10(1) to 10(n) comprises an integrated circuit which perform, at regular intervals, diagnosis evaluation of the module's individual critical parameters such as: its state of health (SOH); its state of charge (SOC); its initial capacity; its delivered capacity; and feeds this data to data management unit 25 along with its electronic signature which is stored into the memory of data management unit 25. The state of charge at the module level is defined as:

SOC(%)=(initial capacity−delivered capacity)/initial capacity expressed as a percentage. The integrated circuit also generates an alarm signal which is relayed to data management unit 25 if it finds any deficiencies within its module such as damaged or defective cells.

When performing its diagnosis, the integrated circuit of each module 10(1) to 10(n) preferably measures the internal resistance of each individual electrochemical cell of a module during small charge or discharge, one cell at a time, to establish the state of health of the module. The state of health of a module, represents the deterioration of the module through chemical degradation and aging and is expressed as a percentage of the initial capacity of the module. The percentage value of the state of health of the module is applied to the initial capacity in the calculation of the module's state of charge. The state of health's value is also used to determine the selection of an initial capacity based on a corresponding discharge curve stored in the memory of the integrated circuit, which is used to calculate the delivered capacity. The delivered capacity is calculated as the current delivered, by the module over time, which represents the area under the discharge curve. The selected initial capacity and the module's state of charge, adjusted with the state of health value, determine the exact available capacity of the module.

Although small, these repetitive discharges are routed into load 20 to avoid wasting any energy while performing diagnosis routine. This feature of the testing procedure enables the system to monitor the state of modules 10(1) to 10(n) at any time with minimal energy wastage.

The determination of the available capacity of each module 10(1) to 10(n) may also be calculated at the level of the Data Management Unit 25. In this case, discharge curves corresponding to various states of health are stored in the memory of data management unit 25 instead of the memory of the integrated circuit and its selection based on measured internal resistance is performed by data management unit 25. Data management Unit 25 receives from each module 10(1) to 110(n), its state of health value and monitors the current delivered by each module over time to calculate the delivered capacity of each module 10(1) to 10(n). Each module's available capacity is then calculated based on the selected initial capacity and the delivered capacity for each LP module 10(1) to 10(n).

Data management unit 25 also monitors load 20 and the cabinet's ambient temperature through load transmitter unit 26. Specifically, a DC current transducer 34 and a thermocouple 35 are connected to load transmitter unit 26 which in turn provides data management unit 25 with ongoing readings of the current drawn by load 20 and actual temperature inside the telecommunication cabinet. The ongoing reading of the current drawn by load 20 is required to establish the exact power requirement of the telecommunication equipment at any given time in order to effectively evaluate the exact back-up time available from battery string 10 relative to the load current. Load fluctuates according to demand and will affect the back-up time available from battery string 10. Furthermore, since telecommunication loads are likely to increase due to additions of regular and high speed lines, the power requirements are likely to increase which in effect will decrease the back-up time available from battery string 10. Data monitoring unit 25 monitors load changes in the telecommunication equipment to insure that when battery string 10 is no longer capable of providing an effective eight hours of back-up time, remote user 30 is made aware that additional modules 10(n) are required to compensate for the load increases.

Each LP modules 10(1) to 10(n) comprises one or more heating element 14 required to maintain or raise the electrochemistry of the LP module to an optimal temperature for a given condition (floating, charge and discharge). Heating elements 14 are resistive elements electrically driven, drawing their required current directly from their respective modules 10(1) to 10(n). The energy drawn by heating elements 14 is therefore not available for as back-up energy and must be subtracted from the individual module's initial capacity to obtain the exact total available capacity of the entire module string 10 to the load in case of power outage or failure. Through experiments, the capacity consumed by heating element 14 through a full discharge has been established as a function of the cabinet's ambient temperature. When the ambient temperature is low (e.g., −40° C. and the like), the heating elements 14 will require more energy then when ambient temperature is high (e.g., 30° C. and the like) and closer to the optimal temperature for discharge condition which is around 60° C. For example, when the ambient temperature of the cabinet is −20° C., 9 Ah will be consumed by heating element 14 over a full discharge at a load current of C/8. The entire range of capacity consumed by heating element 14 for ambient temperature ranging from −40° C. to 65° C. and for various load current has been tabulated and stored into the memory of data management unit 25.

Data management unit's 25 primary function is to monitor the total available capacity of the entire module string 10, the state of health of each module 10(1) to 10(n), to calculate the available back-up time of the power system and make this information available to remote user 30. When the critical parameters of each module 10(1) to 10(n) (state of health, available capacity, initial capacity, delivered capacity, load current at module level) and data from load transmitter unit 26 (ambient temperature and current load) have been received and stored into memory, data management unit 25 proceeds to calculate the total available capacity of the entire module string 10. Data management unit first retrieves from memory the corresponding capacity (Ah) expected to be consumed, by heating element 14 over a full discharge for the ambient temperature and instantaneous load current readings. Data management unit 25 then subtracts the capacity (Ah) expected to be consumed by heating element 14 from the initial capacity (Ah) of each module 10(1) to 10(n) and calculates the total available capacity of the module string 10 as the sum of the corrected available capacities of each module 10(1) to 10(n): Σ(initial capacity−heater capacity−delivered capacity). The total available capacity of the power system expressed in C (Ah) is the total available energy that can be withdrawn from fully charged modules 10(1) to 10(n) for a specific set of operating conditions which include the instantaneous load current and ambient temperature. The back-up time available from module string 10 is the result of the total available capacity C (Ah) of the system divided by instantaneous load current expressed in Amps (A) and is expressed in hours. Best practice dictates that when modules 10(1) to 10(n) are in floating mode, the calculated back-up time remains at or above eight hours. The updated calculated back-up time value is available to remote user 30 in real time.

In discharge mode, the integrated circuit of LP modules 10(1) to 10(n) measures the current perceived at the module level. Since LP modules 10(1) to 10(n) are connected in parallel, the current perceived by each module is a fraction of the current supplied to load 20 and measured by DC current transducer 34. The current load perceived by each module is measured through a shunt resistance as is well known in the art and continuously monitored. The current load perceived by each module expressed in Amps (A) is transmitted to data management unit 25. Data management unit 25 can calculate at any time the delivered capacity of each module 10(1) to 10(n).

Normally, the data management unit 25 is powered by the rectifier used to charge module string 10 in the exterior telecommunications cabinet. In the event of a power outage, LP modules string 10 immediately takes over the supply of DC current to load 20 and to data management unit 25. During loss of primary power, data management unit 25 continues to monitor the battery capacity of each LP module 10(1) to 10(n) by subtracting delivered capacity, and to calculate remaining back-up time based on instantaneous load current readings from load transmitter unit 26 and provides remote user 30 with updated remaining back-up time available from the entire module string 10. The remaining back-up time is updated at short intervals such that the remote user 30 is fully aware of the situation of the telecommunication cabinet in real time.

All data information stored in memory are available for remote user 30 through external communication port 28. Gathering data from modules 10(1) to 10(n) and calculations are ordinarily performed using pre-programmed routine at regular intervals. Intervals as well as calculations may be amended, updated or changed by remote user 30.

The critical issue of reliably predicting reserve time available at each telecommunication equipment site, when a power outage occurs are resolved by using LP modules having integrated electronics and a monitoring system that accurately monitors each battery's SOH and SOC and the equipment electrical load. The result is a back-up power system that can accurately and dynamically determine reliability level based on reserve time available at each telecommunication equipment site, and that monitors each individual module's State of Health and State Of Charge to immediately detect any problems with a module string.

Although the present invention has been described in relation to particular variations thereof, other variation and modifications are contemplated and are within the scope of the present invention. Therefore the present invention is not to be limited by the above description but is defined by the appended claims.

We claim:

1. A back-up power system having a monitoring system for determining and for allowing remote monitoring of a duration of back-up power that can be provided by a plurality of batteries in a given application requiring a given current load, said back-up power system comprising:
   the plurality of batteries, each having an integrated circuit adapted to monitor individual battery's state of health based on an internal resistance measurement; and
   a data management unit operative to evaluate, before back-up power is required, the duration of back-up power available from said plurality of batteries based on a sum of individual battery available capacity, a measured ambient temperature and a continuously updated measured application current load
   a communication link for exchanging data with a remote user, said available back-up time and said measured application current load being accessible to the remote user via said communication link.

2. A back-up power system as defined in claim 1 wherein said individual battery available capacity is obtain by subtracting a delivered capacity of each said plurality of batteries from an initial capacity of each said plurality of batteries, said initial capacity being modified by a value of the state of health of a battery.

3. A back-up power system as defined in claim 2 wherein each said plurality of batteries comprises at least one heating element for controlling individual battery internal temperature, said measured ambient temperature being used to correlate an expected battery capacity consumed by said at least one heating element of all said plurality of batteries; said data management unit subtracting expected battery capacity consumed by said at least one heating element from said initial capacity.

4. A back-up power system as defined in claim 3 wherein said duration of back-up power available from said plurality of batteries is calculated as the sum of individual battery available capacity divided by said continuously updated measured application current load.

5. A back-up power system as defined in claim 4 further comprising a load transmitter unit connected to said data management unit, itself connected to a thermocouple and to a current transducer, said load transmitter unit receiving signals representative of the ambient temperature at the plurality of batteries' location and of the application current load and sending said signals in computer readable form to said data management unit for calculation of said back-up time available.

6. A back-up power system as defined in claim 5 wherein said data management unit comprises a memory in which is stored a table of expected battery capacity consumed by said at least one heating element as a function of ambient temperature and discharge rate.

7. A back-up power system as defined in claim 6, wherein said integrated circuit comprises a memory in which are stored a plurality of initial battery capacities, each initial battery capacity corresponding to a discharge curve representative of a battery state of health; said integrated circuit selecting an initial capacity corresponding to one of said battery discharge curves based on its state of health to determine said delivered capacity, and transferring a value of said delivered capacity to said data management unit.

8. A back-up power system as defined in claim 7, wherein said state of health is defined by a measurement of an internal resistance of individual batteries, said internal resistance representative of the deterioration of a respective individual battery through chemical degradation and aging.

9. A back-up power system as defined in claim 8, wherein said integrated circuit provides an electronic signature with any transfer of data sent to said data management unit.

10. A back-up power system as defined in claim 9, wherein said integrated circuit generates an alarm signal which is relayed to said data management unit if any deficiencies within its corresponding battery is found; said alarm signal accessible by a remote user.

11. A back-up power system as defined in claim 3, wherein said plurality of batteries are Lithium polymer batteries.

12. A method for determining the duration of back-up power that can be provided by a plurality of batteries, at all time, in a given application requiring a given current load, the method comprising:
   coupling a plurality of batteries to a data management unit; each battery of said plurality of batteries having an integrated circuit adapted to monitor individual battery's parameters, and at least one heating element for controlling individual battery internal temperature;
   coupling an application current load reading device and an ambient temperature reading device to said data management unit;
   determining an initial battery capacity based on individual battery's state of health; said state of health defined by an internal resistance measurement;
   calculating individual battery's delivered capacity; correlating an expected battery capacity consumed by said at least one heating element of each said battery based on a measured ambient temperature;
   calculating total available capacity of said plurality of batteries by subtracting said expected battery capacity consumed by said at least one heating element of each said batteries and said delivered capacity from said initial battery capacity to obtain individual battery available capacity; the sum of all individual battery available capacity being the total available capacity of said plurality of batteries;
   calculating duration of back-up power available from said plurality of batteries by dividing total available capacity by a measured current load obtained from said current load reading device; and
   having said duration of back-up power information accessible for remote monitoring at all time.

13. A method for determining the back-up time as defined in claim 12 further comprising the step of storing into a memory of said data management unit a table of expected battery capacity consumed by said at least one heating element as a function of ambient temperature and discharge rate.

14. A method for determining the back-up time as defined in claim 13 wherein said integrated circuit comprises a memory in which are stored a plurality of initial battery capacities, each initial battery capacity corresponding to a discharge curve representative of a battery state of health and battery temperature in table form; said integrated circuit selecting one of said initial battery capacities based on individual battery state of health to determine said delivered capacity, and transferring a value of said delivered capacity to said data management unit.

15. A method for determining the back-up time as defined in claim 11 wherein a plurality of initial battery capacities as a function of battery state of health are stored in said memory of said data management unit; said data management unit selecting one of said initial battery capacities based on data representative of individual battery state of health received from said integrated circuit.

* * * * *